(12) United States Patent
Wilson et al.

(10) Patent No.: US 7,038,512 B2
(45) Date of Patent: May 2, 2006

(54) CLOSED-LOOP INDEPENDENT DLL-CONTROLLED RISE/FALL TIME CONTROL CIRCUIT

(75) Inventors: Timothy M Wilson, Aloha, OR (US); Michael C. Rifani, Portland, OR (US); Songmin Kim, Beaverton, OR (US); Greg Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 10/877,991

(22) Filed: Jun. 29, 2004

(65) Prior Publication Data

US 2005/0285647 A1    Dec. 29, 2005

(51) Int. Cl.
*H03K 5/12*    (2006.01)

(52) U.S. Cl. ...................................... 327/170; 327/112

(58) Field of Classification Search ................ 327/108, 327/109, 112, 170, 175, 176
See application file for complete search history.

(56) References Cited

U.S. PATENT DOCUMENTS

| | | | | |
|---|---|---|---|---|
| 4,527,075 A | * | 7/1985 | Zbinden | 327/175 |
| 6,031,385 A | * | 2/2000 | Ilkbahar | 324/763 |
| 6,047,346 A | * | 4/2000 | Lau et al. | 327/158 |
| 6,154,075 A | * | 11/2000 | Nilson | 327/170 |
| 6,198,322 B1 | * | 3/2001 | Yoshimura | 327/175 |
| 6,288,563 B1 | * | 9/2001 | Muljono et al. | 326/27 |
| 6,362,672 B1 | * | 3/2002 | Geist | 327/170 |
| 6,538,464 B1 | * | 3/2003 | Muljono et al. | 326/27 |
| 6,670,831 B1 | * | 12/2003 | Mashimo | 327/34 |
| 6,670,838 B1 | * | 12/2003 | Cao | 327/175 |
| 6,777,974 B1 | * | 8/2004 | Eichfeld et al. | 326/26 |
| 6,861,877 B1 | * | 3/2005 | Shiah | 327/34 |
| 6,906,567 B1 | * | 6/2005 | Culler | 327/170 |

* cited by examiner

*Primary Examiner*—Kenneth B. Wells
*Assistant Examiner*—Hai L. Nguyen
(74) *Attorney, Agent, or Firm*—Fleshner & Kim LLP (57) ABSTRACT

A system and method for processing signals determines rise and fall times of a driving signal, compares the rise and fall times to desired values, and independently controls the rise and fall times to equal the desired values. The rise and fall times may be controlled by generating one or more first correction bits based on a difference between the rise time and a corresponding one of the desired values, generating one or more second correction bits based on a difference between the fall time and a corresponding one of the desired values, and then separately applying the bits to independently control the rise and fall times of the driving signal. The driving signal may be an I/O signal or another type of signal.

59 Claims, 10 Drawing Sheets

CLOSED-LOOP INDEPENDENT DLL-CONTROLLED RISE/FALL TIME CONTROL CIRCUIT

FIELD

This invention relates to control circuits and methods for generating timing signals.

BACKGROUND OF THE INVENTION

The rise/fall time of signals traveling between a CPU and chipset will often vary because of one or more external influences. These influences include variations in silicon strength caused by process, voltage and/or temperature conditions that exist across large numbers of dies. Uncompensated-for changes in supply voltage also contribute to rise/fall time variations. If left unaddressed, these variations will adversely affect system performance. For example, if the rise/fall time is too slow, timing failures are likely to occur. Conversely, if the rise/fall time is too fast, signal integrity and reliability problems may arise because of large reflections and over/undershoot effects.

Various methods have been proposed for controlling the rise/fall times of I/O driving signals on the motherboard of a computer. One method involves matching the strength of a pre-driver circuit against a predetermined DC resistance. This requires manipulating the resistance portion of an RC delay between the pre-driver and a driver circuit in a Gunning transistor logic (GTL) buffer. Through these manipulations, the turn-on and turn-off rates of the driver can be adjusted, to thereby control I/O rise/fall times.

Another method involves performing on-die termination compensation. According to this method, Rtt compensation bits are used to access a look-up table of slew-rate compensation bits. This table is usually included in a ROM preprogrammed with slew-rate compensation bit settings that correspond to desired pre-driver strengths based on the strength of the Rtt.

The methods described above suffer from a number of drawbacks. For example, both methods take an indirect approach to controlling rise/fall times that is considered to be slow and inefficient. More specifically, in both methods the resistance required to achieve a constant rise/fall time varies across process, voltage, and temperature corners, and the driver of the GTL buffer is compensated so the capacitance portion of the RC delay varies. Also, in both methods the circuit structure used for compensation differs significantly from the pre-driver structure being compensated. This can lead to poor edge rates, even in cases where the compensation circuit works properly.

DESCRIPTION OF THE PREFERRED EMBODIMENTS

Figure 1:
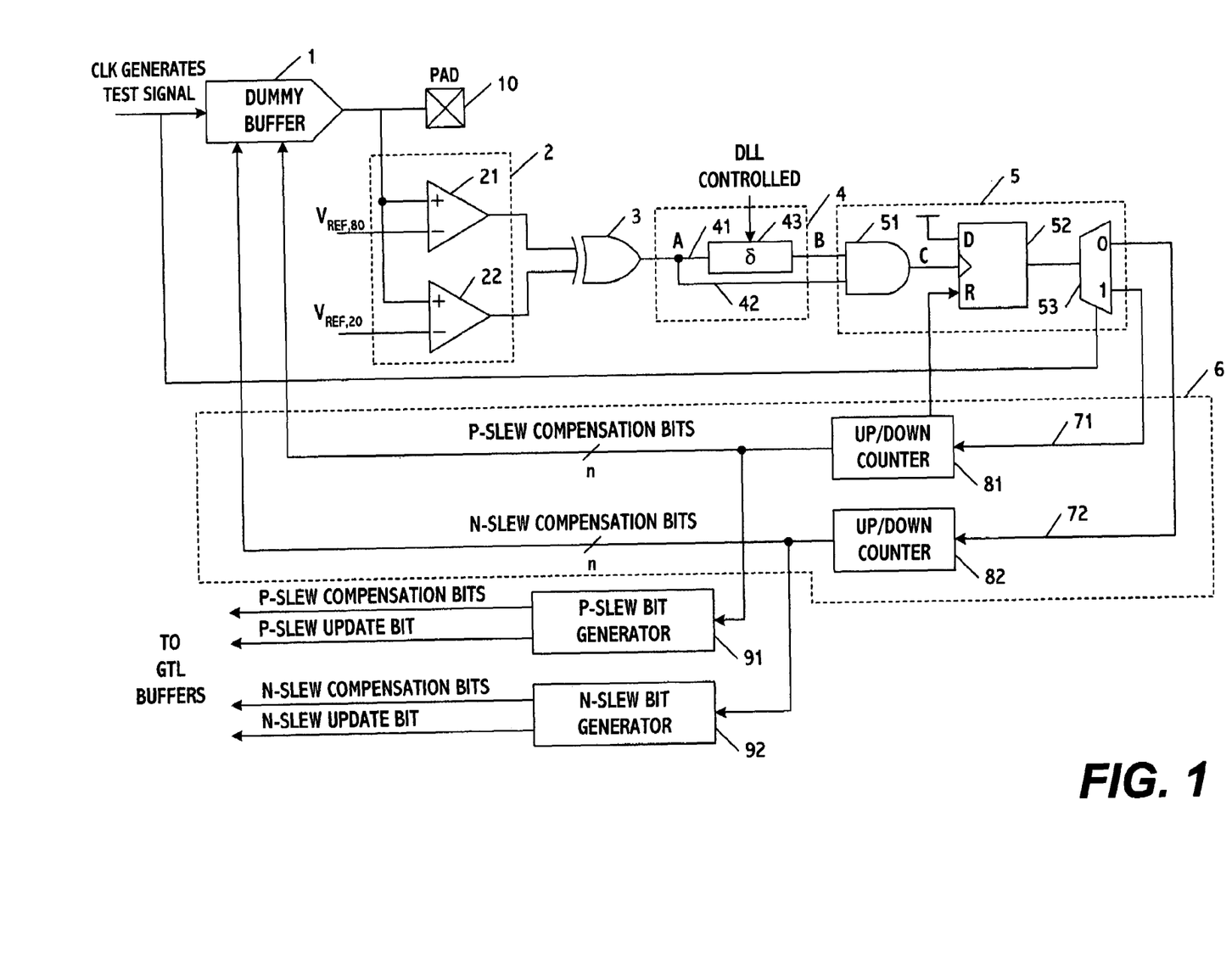
FIG. 1 is a diagram showing a circuit for controlling the rise and/or fall time of driving signals in accordance with one embodiment of the present invention.

FIG. 1 shows a circuit for controlling the rise and/or fall time of driving signals in accordance with one embodiment of the present invention. The driving signals may be any type including but not limited to I/O signals traveling between a CPU and chipset on the motherboard of a computer or other processing system, or ones traveling along chipset/DRAM connections. While the embodiments described herein are ideal for use in controlling high-speed I/O signals, other embodiments may control the rise/fall times of moderately fast signals such as those operating in association with JTAG/ITP ports.

The control circuit includes a dummy buffer 1, a sampling circuit 2, a logic gate 3, a delay circuit 4, a glitch detector 5, and a feedback circuit 6 coupled to the dummy buffer. The dummy buffer generates signals for calibrating the rise/fall times at a signal pad 10, which, for example, may be connected to a power supply on the motherboard. The dummy buffer is preferably an exact replica of the one or more GTL buffers requiring controlled edge rates for their communication internally with external circuits.

The sampling circuit preferably includes two sense amplifiers 21 and 22, which sample the signal input into the pad at predetermined voltage points. This may be accomplished, for example, by comparing the input signal at the non-inverting terminal of the amplifiers to reference voltages, $V_{REF,80}$ and $V_{REF,20}$, input into the inverting terminals. The sense amplifiers therefore effectively function as comparator circuits for sampling the input signal waveform into the pad at specific points.

The logic circuit preferably includes an XOR gate which generates a logical one when the outputs of the sense amplifiers are different logical values. Alternative implementations may use a mask (e.g., an AND gate with one inverted input) to control a single edge, or a pair of mask gates and delay lines to separately control both edges.

The delay circuit shifts the time pulse output from the XOR gate. The delay circuit contains a first signal path 41 and a second signal path 42. The first signal path includes a delay line 43 for delaying the output of the logic gate by a predetermined time. This time (δ) may be programmed by a control circuit (such as a delay-locked loop (DLL)), which sets δ to a value that corresponds to an intended rise/fall time at the pad. The second signal path carries the output of the logic gate preferably without delay.

The glitch detector effectively compares the time pulse from the delay line to the programmed delay δ. That is, this detector determines whether the test pulse has a pulse width (or duration) longer than the programmed delay on the delay line. If the duration of the time pulse is longer than the programmed delay of the delay line, the detector will output a glitch signal. Conversely, if the duration of the time pulse is shorter than the programmed delay, no glitch signal is produced.

The glitch detector may take any one of a variety of forms. One form, shown in FIG. 1, includes an AND gate 51 coupled to a D flip-flop 52. The AND gate generates a clock signal based on a comparison of the time-pulse output from the delay line along path B and the non-delayed signal along signal path 42. This clock signal drives the clock input of the D flip-flop, which has its D terminal connected to a supply or reference voltage and its reset terminal R connected to the output of an Up/Down counter in the feedback circuit. The manner in which the foregoing elements cooperate to generate a time pulse (e.g., a square wave) will now be described in greater detail.

When the pad output signal rises, the two sense amplifiers transition at different points in the output waveform. Both amplifiers output a low level when the pad output signal is below the trip point of both sense amplifiers, and a high level when the pad output signal is above the trip point of both sense amps. The amplifier outputs differ when the pad output is between the trip points. The XOR gate converts the two sense amplifier outputs into a signal that indicates when the pad output signal is between the trip points of the amplifiers, or equivalently it generates a high pulse for a time equal to the time that the pad output signal is between the two sense amplifier trip points. One example of these trip points may be 20% and 80% of the waveform transition.

Given these illustrative values, during steady state the two sense amplifiers will output the same value. This will cause the XOR output to be '0'. When a transition at the pad occurs, it will cross the 20% and 80% reference points of the sense amplifiers at different times, and one of the amplifiers will trip before the other. This will cause the two inputs to the XOR gate to be different, and will drive a '1' out of the XOR gate for the duration that the two amplifier outputs are different. When the pad transition crosses the other reference point, the amplifier outputs will again be the same, and the XOR will again output '0.' The result will be a high pulse out of the XOR gate, and the width of that pulse will be equivalent to the time that the pad voltage spent between the two reference values of the sense amplifiers. Useful information is stored in the width of the pulse. This correlates to the transition time of the I/O signal at the pad.

The pulse output from the XOR gate is passed through a delay line and then ANDed with itself. This process produces a glitch on the output of the AND gate if the pulse is wider than the delay line. No glitch is produced if the pulse width is shorter than the delay of the delay line.

More specifically, the delay circuit is programmed to a predetermined transition time, i.e., an intended time the pad signal should spend between the two sense amplifier reference points. The output of the XOR gate is sent through this delay line. The output of the delay line and the output of the XOR gate are then sent to the AND gate. If the programmed delay through the delay line is less than the length of the XOR gate pulse, both inputs to the AND gate will be high at the same time. This will cause a glitch at the output of the AND gate, which will clock the phase detector and record a '1' at the output of the phase detector. (In this embodiment, flip-flop 52 may serve as the phase detector).

This output will therefore be in the form of a digital square wave, which indicates that the actual pad transition time was longer than the programmed time (the pad signal transitioned slower than desired). On the other hand, if the delay through the delay line is longer than the length of the XOR gate pulse, the AND gate inputs will not be high at the same time. The output of the phase detector will remain '0,' indicating that the pad signal transitioned faster than intended. In at least one alternative embodiment, the AND gate may be removed to reduce hardware requirements.

The glitch therefore indicates whether the transition time of the pad output signal is too slow (e.g., a long pulse on the output of the XOR gate produces a glitch) or too fast (e.g., a shorter pulse on the output of the XOR gate fails produces a glitch). This information is then provided to a "bang-bang" controller that ensures that the rise or fall time is always as close to the reference transition time as possible.

More specifically, the glitch detector captures any glitch that appears at the output of the AND gate. If a glitch is captured, the intended delay (as programmed into the delay line) is judged to be shorter than the measured delay at the pad. If no glitch is seen, the desired delay is judged to be longer than the measured delay. The glitch detector is shown as including a D flip-flop in this embodiment. Other types of detectors may be used in alternative embodiments.

The output of the D flip-flop is connected to a demultiplexer 53, whose selector signal is controlled by the test signal input into the dummy buffer. This control ensures that rising and falling edges are controlled separately and not confused with one another. The test signal is preferably generated from a clock signal generator (not shown), although other signal-generation circuits may be used. When the selector signal assumes a first value, the demultiplexer passes the Q value of the D flip-flop to a respective portion of the feedback circuit. When the selector signal assumes a second value, the demultiplexer passes the Q value of the flip-flop through another respective portion of the feedback circuit. The output values of the demultiplexer control the P-slew and N-slew compensation bits input into the dummy buffer.

The feedback loop of the present embodiment includes first and second signal paths 71 and 72, which are preferably separate from one another. The first signal path may be used, for example, to control the fall time of signals input at the pad and the second signal path may control the rise time of those signals. These separate paths enable the present embodiment to independently control the rise and fall times at the pad to thereby enhance system accuracy and performance.

This independent control is achieved by inputting an appropriate selection signal into the demultiplexer. As previously indicated, the selection signal preferably corresponds to the test signal input into the dummy buffer. If the test signal has a rising edge, the demultiplexer is controlled to pass the glitch signal along signal path 72. Conversely, if the test signal has a falling edge, the demultiplexer passes the glitch signal along signal path 71. Each signal path includes a counter circuit, e.g., signal path 71 includes Up/Down counter 81 and signal path 72 includes Up/Down counter 82.

Counter 81 generates a digital signal including a predetermined number (n) of P-slew compensation bits, and counter 82 generates a digital signal including a predetermined number (m) of N-slew compensation bits. The P-slew and N-slew compensation bits respectively control the strength of the pull-up and pull-down within the pre-driver. The pre-driver can be viewed as an inverter with multiple legs that can be enabled. The strength of the PMOS devices will control the rising edge of the N-channel (falling edge at the pad) and the strength of the NMOS devices will control the falling edge of the N-channel (rising edge at the pad). This allows independent compensation of the rising and falling transition times at the pad. When the pre-driver has a stronger pull-up, its output rises faster. This results in a faster falling edge on the output of the (inverting) driver.

The compensation bits, thus, adjust the slew rate of the test (or clock signal) input into the dummy buffer to an intended value. The value of n may be the same or different from m.

The target slew rate (measured, for example, in volts/ nanosecond) is the difference between the sense amplifier trip points divided by the reference delay. One slew rate which may be used in this embodiment resides rate between 2.5 V/ns and 6 V/ns. A slew rate that is too fast will cause overshoot and undershoot on the bus. This causes oxide reliability and signal integrity problems, which will cause a platform to not operate correctly. Slew rates that are too slow will cause timing failures. Slew rates with the above values will typically result in around 1 V/ns edges at the receiver. If the voltage swing is 1 V, that will be a 1ns transition time. An 800MT bus, for example, has a bit period of 1.25 ns. In this example, a lesser slew rate may be used but, if so, may cause a break in timing.

The slew compensation bits are generated based on the count values stored in the Up/Down counters 81 and 82 respectively. These bits are output continuously, but change each time an output edge is "measured." More specifically, the Up/Down counters are clocked by the same clock that generates the target signal into the dummy buffer. Once the counters are clocked, the outputs are immediately sent to the dummy buffer in the compensation circuits. However, before being distributed to the GTL buffers on the bus, the count values go through the update filters (91 and 92).

Based on the enable and the output of the demultiplexer, the up/down counters will increment or decrement when clocked. The count values (compensation bits) are passed through the update filters (e.g., digital low-pass filters) before being used by the regular output buffers, in order to avoid having those buffers be subject to the continual "hunting" that takes place in a "bang-bang" controller. The compensation bits therefore correspond to the count values in the Up/Down counters. The bits that are actually sent to the GTL buffers preferably lag the counters to filter out steady-state toggling.

The count values are controlled based on the output of the demultiplexer. Assuming that a larger count causes the pre-driver to have a greater strength, the counter increments when a "1" value is output from the demultiplexer. This occurs when there is a glitch on the AND gate, e.g., when the transition time is too slow. The counter decrements when a '0' value is output from the demultiplexer. This occurs when no glitch is detected, e.g., when the transition time is too fast. In a practical application, the counters may be initialized at start up to a predetermined value, for example, such as zero or a mid-range value.

The P-slew and N-slew compensation bits are fed into the pre-driver of the dummy buffer. (See FIG. 5 for one possible implementation). The pre-driver controls the turn-on and turn-off rate of the pull-down device, which in turn controls the edge rate at the pad. The compensation bits therefore control the strength of the dummy buffer, for example, by enabling or disabling parallel tri-state structures to modulate the pre-driver strength.

The control circuit of the present embodiment also includes a P-slew generator 91 and an N-slew bit generator 92. The P-slew bit generator outputs one or more P-slew compensation bits and P-slew update bits based on the count value output from Up/Down counter 81. The N-slew bit generator outputs one or more N-slew compensation bits and N-slew update bits based on the count value output from Up/Down counter 82. As previously indicated, generators 91 and 92 may include digital low-pass filters for preventing hunting effects.

In order to generate their outputs, the P-slew and N-slew bit generators are fed the same up/down bit from the demultiplexer. They then compare the last two values of this bit, and if they are the same it clocks the counter outputs and sends them to the GTL buffers. If they are not the same, it will not update. The compensation bits output from generators 91 and 92 are delayed versions of the dummy buffer bits. In steady-state operation, the compensation machine may toggle between two bit settings. One will be slightly slower than the target, and one slightly faster. To avoid sending this steady-state toggle behavir out to the GTL buffers, the update filter (slew generator) is inserted. The P-slew/N-slew update bits tell the GTL buffers to clock in new values when the compensation unit sends them.

The control circuit therefore directly controls the rise/fall time of the driving signals. In accordance with the present embodiment, this is accomplished by monitoring the rise/fall time at a signal pad, and then controlling pre-driver strength in a GTL I/O buffer to achieve a predetermined time. This strength is controlled using a feedback system, in which pull-up and pull-down strengths of the pre-driver are independently controlled to adjust the fall and rise time of the I/O respectively. The pre-driver strength is varied over different process, voltage, temperature and/or other external influences to achieve the desired rise/fall time. This is preferable over other proposed methods, which use a fixed pre-driver strengths with varying rise/fall times across variable conditions.

By controlling rise/fall time in this manner, the maximum bus frequency may advantageously be increased to achieve improved system performance. More specifically, as previously mentioned a trade-off exists between signal integrity and timing margin for purposes of determining edge rates. If they are not compensated and allowed to vary over process, voltage, and temperature, they will negatively affect the maximum operating frequency of the front-side bus. The embodiments of the present invention perform this compensation function to allow the operating frequency of the front-side bus (or any other system in which this control is implemented) to attain a maximum or optimal value. This is further evident as follows.

In an interface application, signals are conveyed from output to input by wiring across a board and the packages containing the integrated circuits. Because the board and packages are manufactured separately, their traces will likely have differences in characteristic impedance. In addition, discontinuities may exist in the interfaces between these media, e.g., the socket into which the CPU is plugged.

The ability of a signal to tolerate these discontinuities is related to its edge rate. Slower edges correspond to longer wavelength signals and are thus less effected by small or short impedance discontinuities in the signal path. The discontinuities can generally be minimized but doing so raises product costs. Cost, therefore, serves as one constraint on achieving the fastest edges possible.

The system requirements also place delay restrictions on the signals, e.g., the signals must travel from driver to receiver in a single clock cycle. A signal that transitions from low to high too slowly will be unable to meet the required system timing. The performance expectations of a product therefore serve as a limitation on the slowest edges that can be used.

Better control of the edge rates produced by a circuit, thus, permits tighter limitations on the edge rate in a system, either enabling faster systems for the same cost or less expensive systems at the same performance. The embodiments of the present invention may be applied to provide this improved control, to thereby achieve these performance enhancements.

Figure 2:
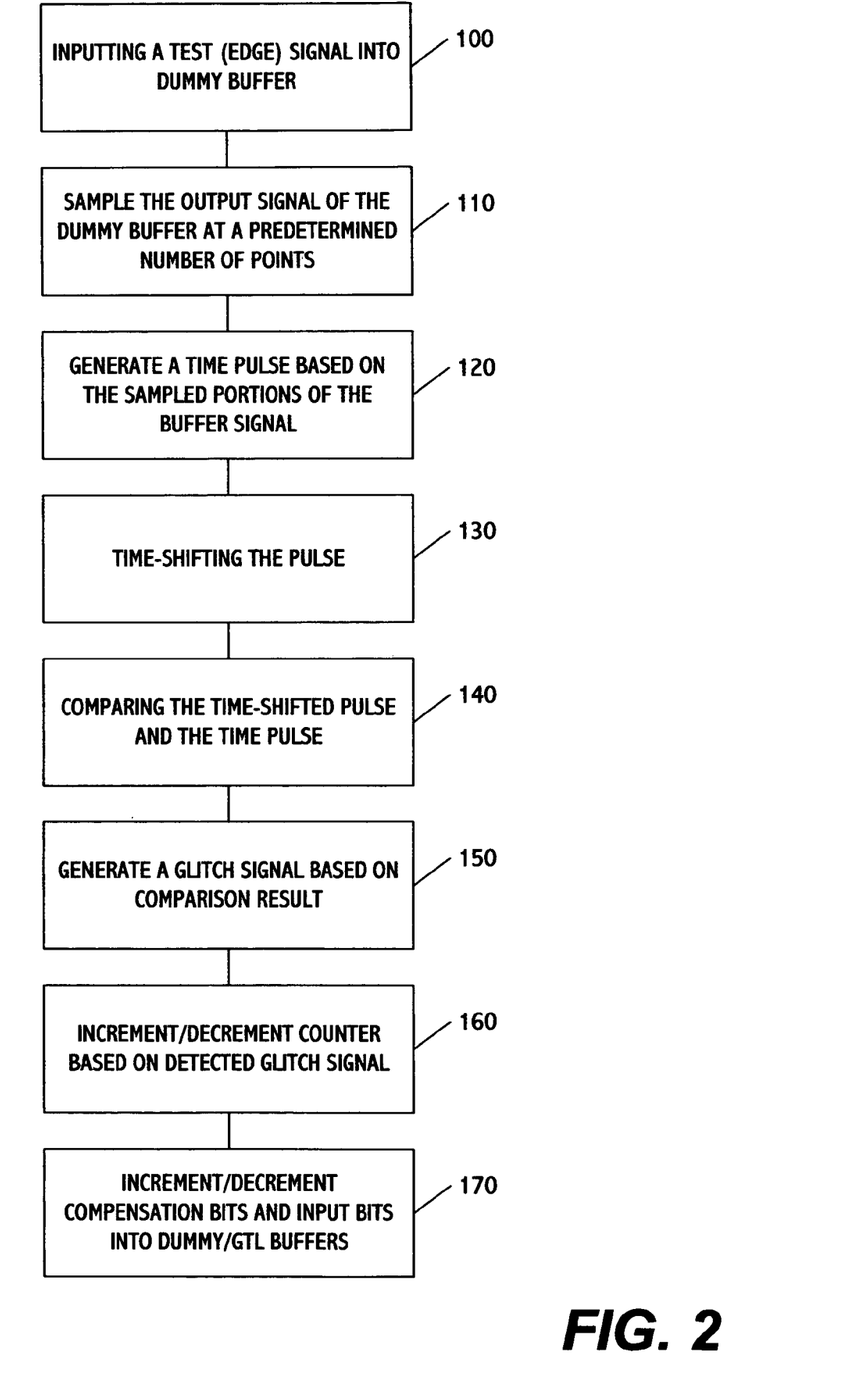
FIG. 2 is a flow diagram of functional blocks included in a method for controlling the rise and/or fall time of driving signals in accordance with an embodiment of the present invention.

FIG. 2 shows functional blocks included in a method for controlling the rise and/or fall time of I/O driving signals in accordance with one embodiment of the present invention, which embodiment is preferably but not necessarily performed using the control circuit of FIG. 1.

Initially, a test pulse (or edge) is sent to the dummy buffer according to a predetermining timing. (Block 100). The test pulse may be output from a clock generator and the timing of the test pulse may be, for example, once every five bus clocks. For other applications, the timing may be different. Since the dummy buffer has a structure identical to the GTL buffer, the test pulse may correspond to the data input of the pre-driver discussed in greater detail below.

The rising/falling edge of the signal output to the pad is sampled at two predetermined voltage points. (Block 110). These points may correspond to 20% and 80% of the rising or falling edge respectively, or may correspond to one or more different points on the edge transition. A trade-off exists in selecting these points.

For example, the further the distance between them, the wider the pulse that is to be measured. This makes measurement more accurate. However, the high reference point must maintain some distance from the power rail in order for the sense amplifiers to operate correctly and prevent noise, and to avoid any glitches from overshoot and ring back on the pad. The points of 20% and 80% points may be preferred for many applications but are no means the only points that may be used.

The sampled values are sent to an XOR gate, which produces a time pulse having a duration at least substantially equal to the time δ between the two sampled points. (Block 120). This pulse is the time-shifted by passing it through the DLL-controlled delay line. (Block 130). The delay line shifts the pulse by an amount equal or proportional to an intended rise/fall time at the pad, e.g., as previously mentioned the target edge rate is the difference between the sense amplifier trip points divided by the delay line delay. For a 1-volt swing with 20% and 80% transition measurements and a 300 ps delay, the target slew rate will be (0.8 V–0.2 V)/(300 ps)=2 V/ns.

Figure 3A:
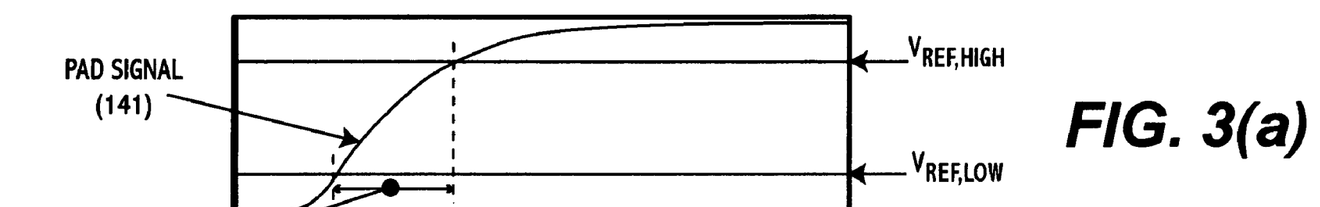
FIG. 3(a) shows an example of a pad signal sampled by the circuit of FIG. 1 at high and low reference voltages, FIGS. 3(b), (c), and (d) respectively show corresponding pulses produced at points specific points in this circuit.
Figure 3B:
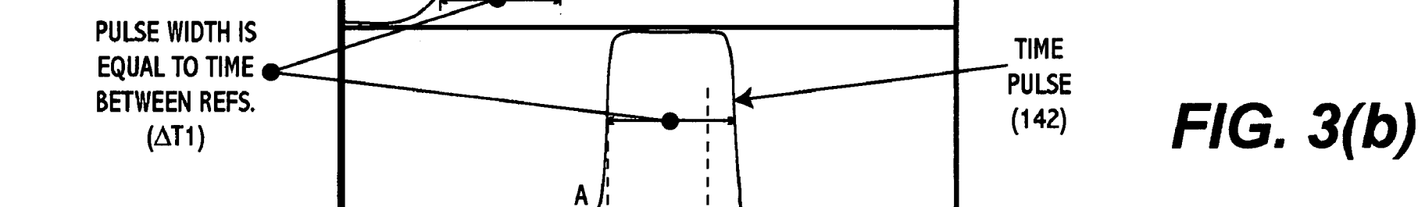
Figure 3C:
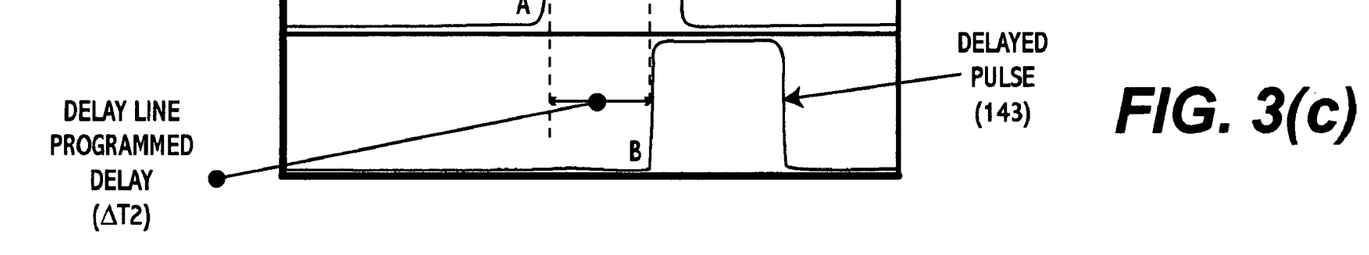
Figure 3D:
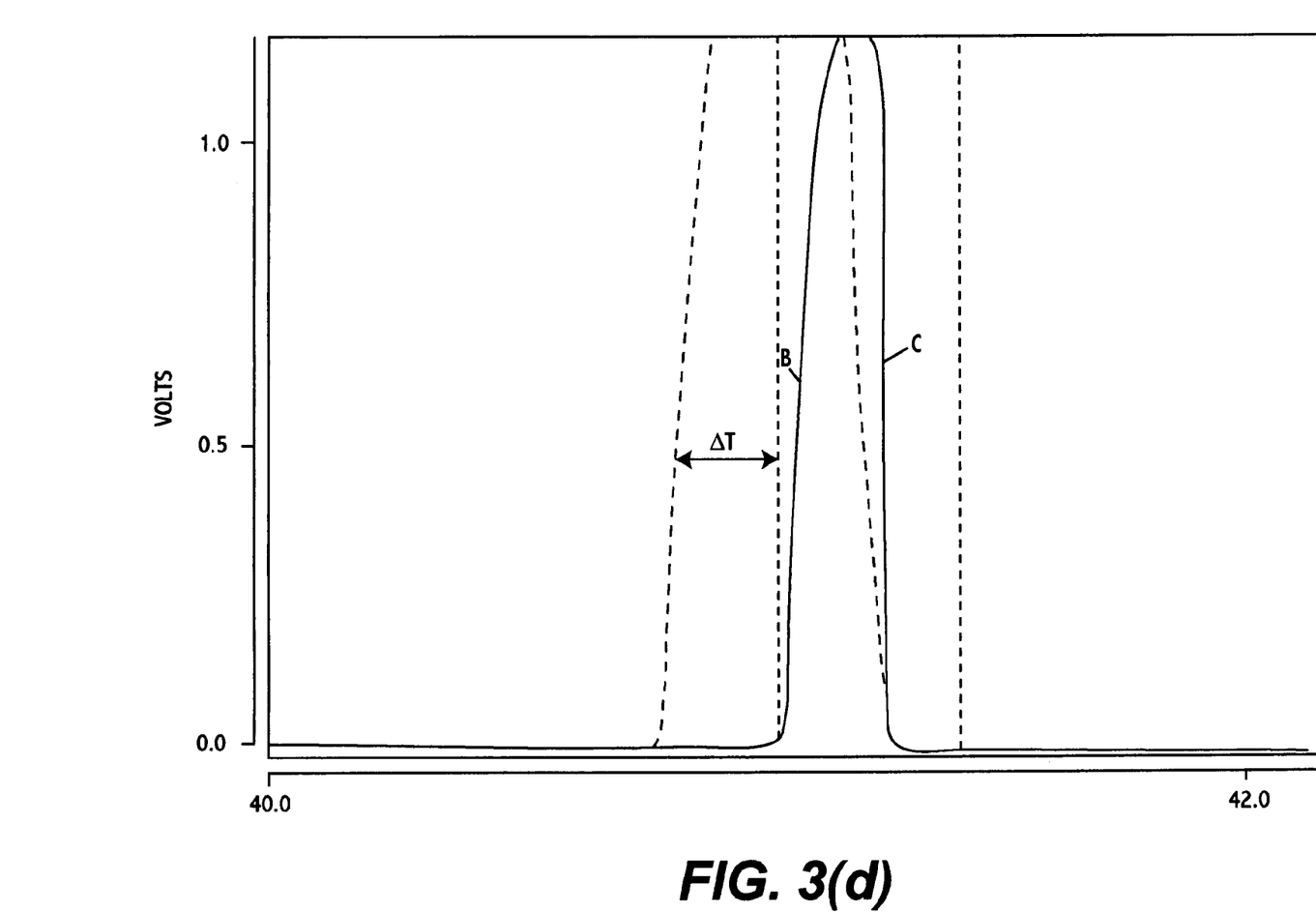

The time pulse and its time-shifted version are then compared, for example, using the AND gate. (Block 140). FIG. 3(a) shows an example of a pad signal 141 between high and low reference voltages, $V_{ref,high}$ and $V_{ref,low}$, corresponding to the sense amplifiers, and FIGS. 3(b) and (c) respectively show corresponding pulses 142 and 143 produced at points A and B along the first signal path of the delay circuit. Here, the pulse width (ΔT1) at least substantially equal to the time between the reference points and ΔT2 represents the delay programmed into the delay line. This time shift between pulses A and B determines the adjustment in rise/fall time at the pad. While pulses A and B have substantially the same amplitude and duration, pulse B has a shape with more defined edges. FIG. 3(d) shows another view of pulses A and B and a waveform C which corresponds to the output of the AND gate this in this embodiment.

Based on the result of the comparison, a glitch signal will be generated. (Block 150). A glitch signal will be generated, for example, if the duration of the time pulse is longer than the programmed delay of the delay line. If the time pulse is shorter than the programmed delay, no glitch signal will be generated. More specifically, ANDing the original pulse and its time shifted version produces a glitch if the time shift failed to move the rising edge of the time-shifted pulse past the falling edge of the original pulse, e.g., if the pulses overlap the AND gate will generate a pulse. If the time shift moved the rising edge of the time-shifted pulse past the falling edge of the original pulse (e.g., the shift is longer than the pulse duration), then the original and the time-shifted pulses do not overlap and no glitch signal is generated.

When a glitch signal is generated, it is detected and a determination is made as to whether the intended delay (as programmed into the delay line) is shorter than the measured delay at the pad. If no glitch is seen, the intended delay will be judged to be longer than the measured delay.

When a glitch signal is detected, it is input into slew compensation circuitry, which, for example, is included along the feedback loop emanating from the demultiplexer output. The compensation circuits for the rise and fall time measurements are preferably independent from one another, i.e., the rise and fall times at the pad are independently controlled to achieve an intended calibration at the pad. In FIG. 1, this independent control is effected by passing the output of the D flip-flop along one of two signal paths 71 and 72.

More specifically, the output of the glitch detector is sent to the demultiplexer, which is controlled based on the test pulse into the dummy buffer. The result of the glitch detector is sent to one of counters 81 and 82 based on the selection signal input into the demultiplexer. When the selection signal assumes a first value (e.g., corresponds to a rising edge of the test signal), the glitch signal is output to counter 82. And, when the selection signal assumes a second value (e.g., corresponds to a falling edge of the test signal), the glitch signal is output to counter 81.

Counter 81 increments or decrements the P-slew compensation bits into the dummy buffer, and counter 82 increments or decrements the N-slew compensation bits. (Block 160). These bits correspond to their respective count values. The counters increment or decrement these values based on the state of the flip-flop (e.g., whether or not a glitch signal was produced or not) on every clock they receive. The count values will be incremented or decremented based on the polarity of the glitch signal, which in this embodiment corresponds to a '0' or '1' output from the demultiplexer. Preferably, to support this operation, the clocks to the counter should arrive after any possible glitch has been generated.

The updated count value is used as a basis for generating one or more slew compensation bits into the dummy buffer. That is, once the compensation bits are updated they are clocked out to the dummy buffer as well as to all or a portion of the GTL buffers in the system. (Block 170). These buffers may reside on the same chip with the time control circuit or may be provided on different chips or boards. Counters 81 and 82 output the compensation bits to the GTL buffers through P- and N-slew bit generators 91 and 92 respectively, once a count update occurs. Preferably, at the same time, a reset signal is asserted on the R input of the flip-flop portion of the glitch detector to clear information derived from the previously edge measurement.

After the compensation bits of the dummy buffer are updated, the test pulse is toggled and sent to the dummy buffer for the next measurement. More specifically, the slew bits control the pre-driver in the dummy and GTL buffers. That is, the pre-driver controls the rate of turn-on or turn-off of the n-pull down device, which in turn controls the transition rate on the pad. See above Thus, as previously discussed, the compensation bits control the pull-up and pull-down strengths of their pre-drivers.

Figure 4A:
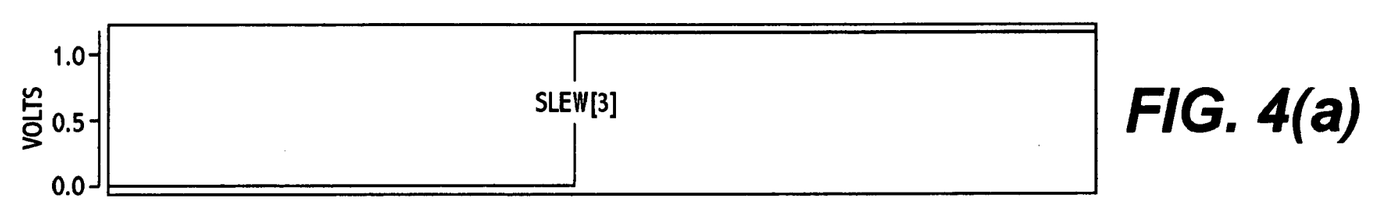
FIGS. 4(a)–(d) are graphs showing examples of outputs of one of the Up/Down counters of the circuit of FIG. 1 used to generate the N-slew compensation bits of the pre-driver.
Figure 4B:
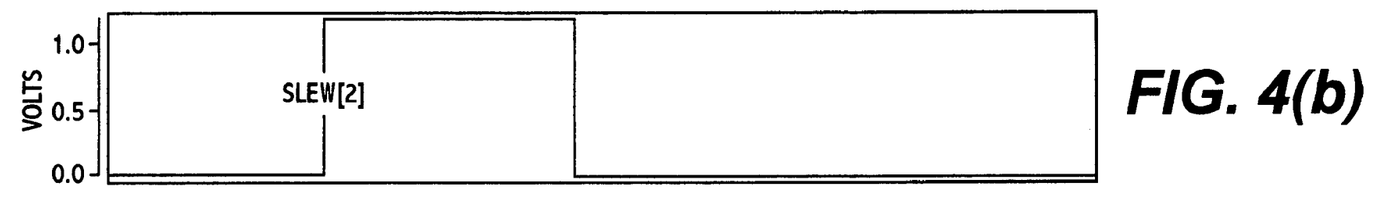
Figure 4C:
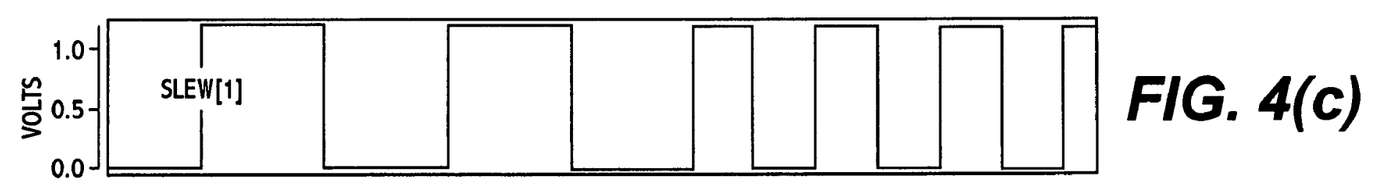
Figure 4D:
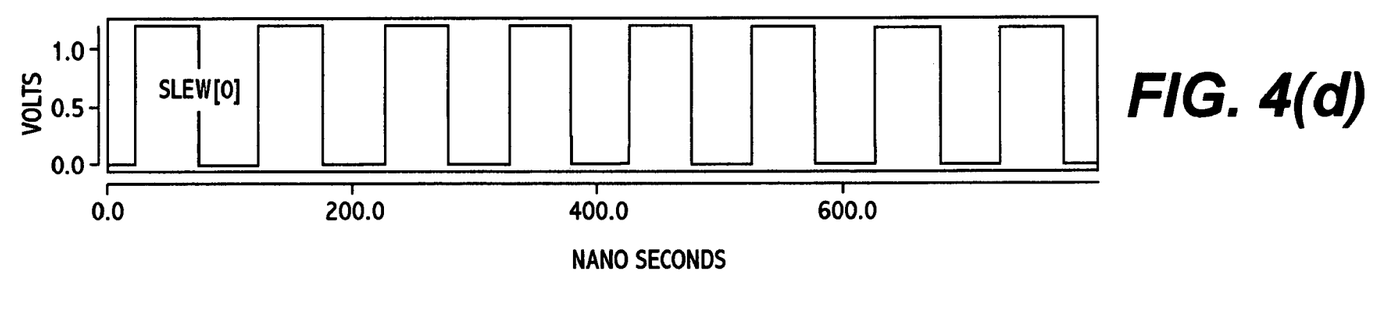

FIGS. 4(a)–(d) are graphs showing examples of output signals from counter 82 generated during a simulation performed for generating the N-slew compensation bits of the pre-driver. These output signals are presented in a manner which reflects the results of phase detector. FIG. 4(a) shows that the counter was initialized to '0.' FIGS. 4(b)–(d) show that the continued to count up until the phase detector indicated that the transition time was too fast. Then, steady-state toggling was performed. This graphs therefore serve to show that full-loop compensation operates correctly, i.e., the counter initializes to '0' and the sense amplifiers, delay line, AND gate, and phase detector worked together to increment the counter until the transition at the pad matched the programmed delay of the delay line. Steady-state toggling was then entered into.

More specifically, the aforementioned graphs show the counter incrementing from 0 up to 9, and then steady stage toggling begins. Once FIGS. 4(a) and 4(b) settle out, it can be seen that FIGS. 4(c) and 4(d) continue to toggle in a repeating pattern, which corresponding to steady state toggling.

The waveforms for the P-slew counter are comparable to FIGS. 4(a)–(d). The two counters are independent, in that both the rising and falling edge will compensate to the desired edge rate independently. The bit values for P-slew and N-slew may therefore be different at steady state.

For the conditions simulated, the N-slew bits were incremented to a value of 9, at which point the transition time at the pad was determined to be shorter than the delay line. The Up/Down counter was therefore decremented to 8. In steady-state operation, the compensation bits may be toggled between two values. Therefore, in accordance with at least one embodiment the bits may be filtered before being sent to one or more GTL buffers. One filtering technique that may be used involves requiring a predetermined number (e.g., two) of consecutive up or down counts before updating the compensation bits. This will eliminate steady-state oscillation behavior at the GTL buffers.

Figure 5:
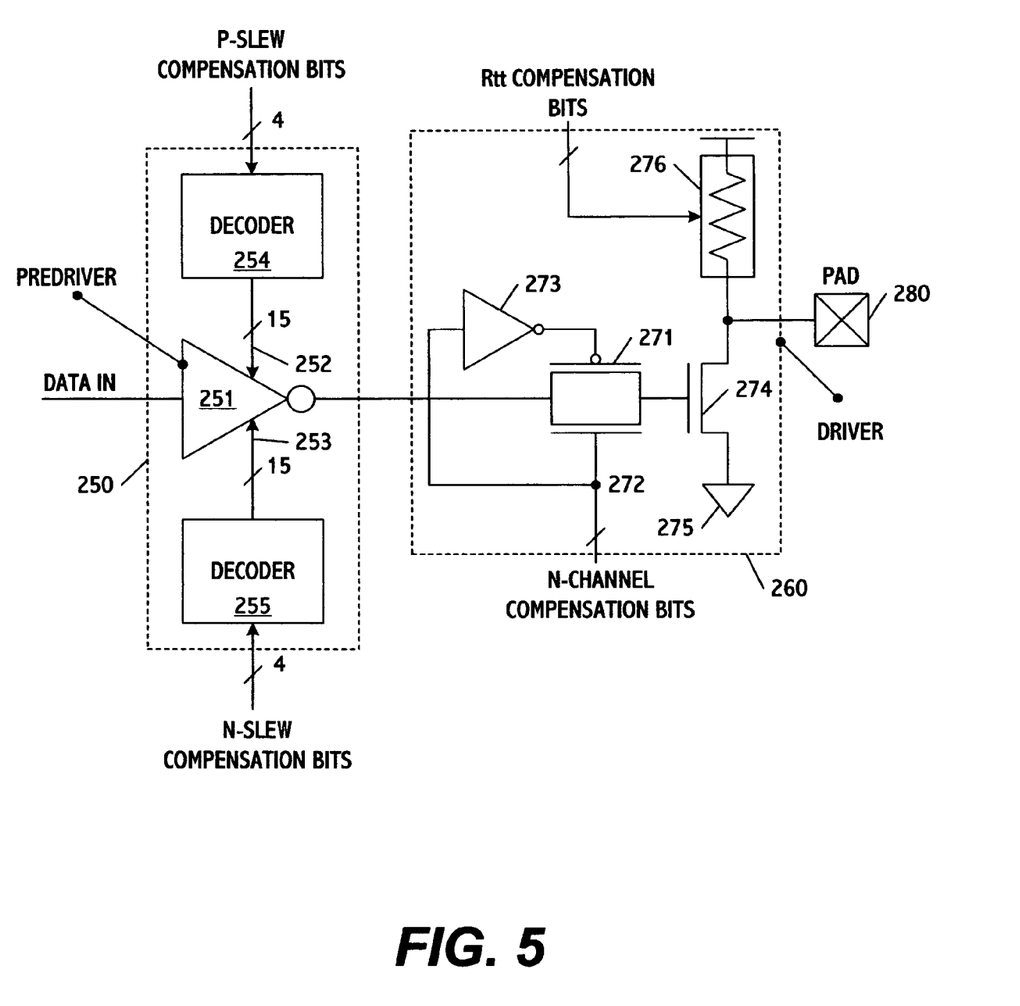
FIG. 5 is a diagram showing one type of GTL buffer that may be controlled by the slew compensation bits output from the control circuit of FIG. 1.

FIG. 5 shows one type of GTL buffer that may be controlled by the slew compensation bits output from the control circuit of FIG. 1. This buffer includes a pre-driver circuit 250 coupled to a driver circuit 260. The pre-driver circuit may be formed from an operational amplifier 251 with control inputs 252 and 253 respectively output from first and second decoder circuits 254 and 255. The first decoder decodes the P-slew compensation bits output from bit generator 91, and the second decoder decodes the N-slew compensation bits output from bit generator 92.

Each decoder transforms the slew compensation bits into a control voltage. In generating this voltage, the decoder essentially operates as a multiplexer. That is, the decoder takes the binary encoded outputs from the counter and converts them to thermometer coding. In this illustrative embodiment the pre-driver has 15 controllable legs. Given this configuration, decoding may be performed as follows:

| Encoded bits | Decoded bits |
|---|---|
| 0000 | 000 0000 0000 0000 |
| 0001 | 000 0000 0000 0001 |
| 0010 | 000 0000 0000 0011 |
| 0011 | 000 0000 0000 0111 |
| 0100 | 000 0000 0000 1111 |
| 0101 | 000 0000 0001 1111 |
| 0110 | 000 0000 0011 1111 |
| 0111 | 000 0000 0111 1111 |
| 1000 | 000 0000 1111 1111 |
| 1001 | 000 0001 1111 1111 |
| 1010 | 000 0011 1111 1111 |
| 1011 | 000 0111 1111 1111 |
| 1100 | 000 1111 1111 1111 |
| 1101 | 001 1111 1111 1111 |
| 1110 | 011 1111 1111 1111 |
| 1111 | 111 1111 1111 1111 |

The decoded bits control the strength of the pre-driver, but do not control any amplifier. The more legs that are enabled, the bigger the effective devices and the stronger the drive strength. This will turn on or turn off the n-pull down device more strongly. That, in turn, will affect the transition time of the signal at the pad.

The driver circuit includes a pass gate formed from drain-to-drain, source-to-source coupled transistors 271 and 272, an inverter 273, a transistor 274 coupled to a reference potential (e.g., ground) 275, and a resistive element 276. Transistor 274 is the n-channel pull down transistor that causes a falling edge to appear on the pad. This pull-down device may alternatively be formed from several devices in parallel which are enabled by a different compensation circuit (not shown) that controls the strength of the device. The pre-driver controls how strongly or weakly this device is turned on. A separate compensation loop controls the N-channel bits. These bits control the strength of the N-channel, whereas the pre-driver controls how quickly it turns on or off.

In operation, N-channel compensation bits are input into the gates of the pass-gate transistors. These bits are translated into voltages which cause the pass gate to input the pre-driver output into the gate of transistor 275. If the pre-driver output activates this transistor, the pad 280 is connected to ground or a predetermined reference voltage. If the pre-driver output does not activate transistor 275, the pad voltage is controlled by the value output from the resistive element. This value is controlled by Rtt compensation bits, which are explained in greater detail below.

In order to minimize reflections on signals, the signals must terminate with a matched impedance. This termination resistance is called "Rtt". In modern microprocessors, the termination resistance is implemented on a CPU die (or on the chipset die at the other end of the signal). Since the absolute tolerance of components on semiconductor technologies is not very precise, a compensation state machine (not shown) may be used to compensate for process, voltage, and temperature variations changes impact upon the Rtt devices. These state machines are known.

The value of the voltage output to the pad may be determined as follows. The Voh and Vol levels at the pad are determined by the strength of the Rtt and N-channel pull-down. When a '1' is driven on the pad, the N-pull down is off, the Rtt pulls the pad voltage to Vtt. So, Voh=Vtt. When a '0' is driven on the pad, the N-pull down is on, and pulls against the Rtt. The target Rtt value is 60 ohms, and the target N-channel value is 10 ohms. The motherboard has a 60 ohm resistor tied to this pad, so there is an equivalent 30 ohm resistance to Vtt. As a result, 30 ohms goes to Vtt and 10 ohms goes to Vss when driving a low. Vol=0.25*Vtt. (FIG. 5 is a generic description of an output buffer. A copy of this buffer is implemented in the RFTC, and in this case pad 280 would be the same as pad 10 in FIG. 1. Each I/O may have a similar circuit attached to a pad, but those other cells will have different pads.)

Figure 6:
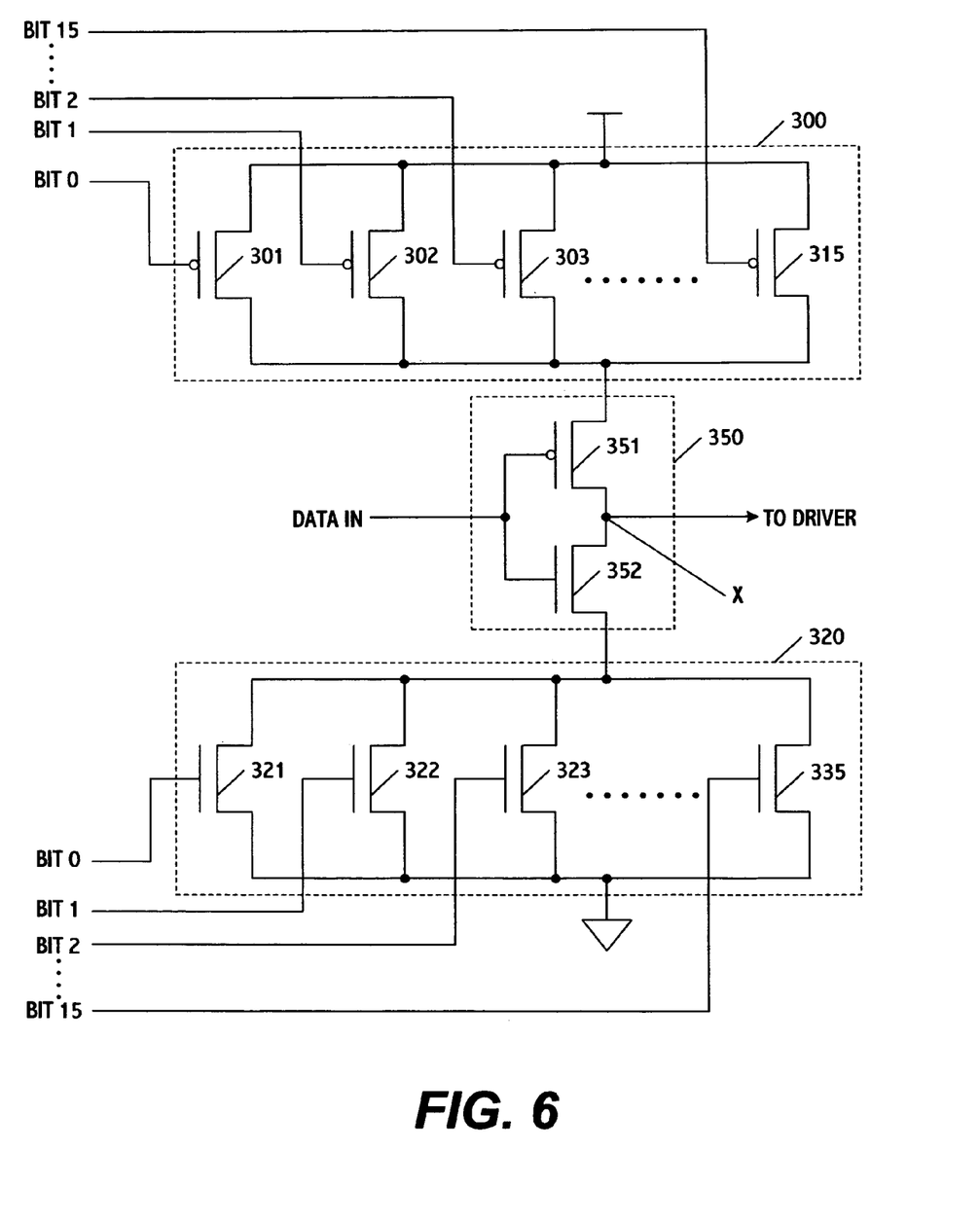
FIG. 6 is a diagram showing an example of a pre-driver circuit that may be used in the GTL buffer of FIG. 2.

FIG. 6 shows an example of a pre-driver circuit that may be used in the GTL buffer of FIG. 2. This circuit includes an array 300 of N-channel pull-up devices 301–315 and an array 320 of P-channel pull-down devices 321–335. The arrays are connected to a circuit 350, which includes a P-channel transistor 351 and an N-channel transistor 352. The number of pull-up/pull-down devices in the arrays preferably equals the number of P-slew and N-slew compensation bits respectively. The gates of transistors 351 and 352 are connected to the data input terminal and a node X between these transistors is connected to the pass-gate of the driver circuit.

In operation, the slew compensation bits control the RC time constant between the driver and pre-driver of the GTL buffer. More specifically, when P-slew compensation bits are received, bits having a logical zero value turn on a respective number of pull-up transistors, thereby controlling the value output to the driver. (Pull-up is accomplished based on a supply voltage 380 connected to sources of the P-channel transistors). When the N-slew compensation bits are received, bits having a logical one value turn on a respectively number of pull-down transistors, thereby controlling the value output to the driver. (Pull-down is accomplished based on a reference voltage (e.g., ground) 390 connected to drains of the N-channel transistors). Controlling the RC time constant in this manner adjusts the rise/fall times at the pad, by controlling the turn-on and turn-off rate of the N-channel pulldown devices.

Figure 7:
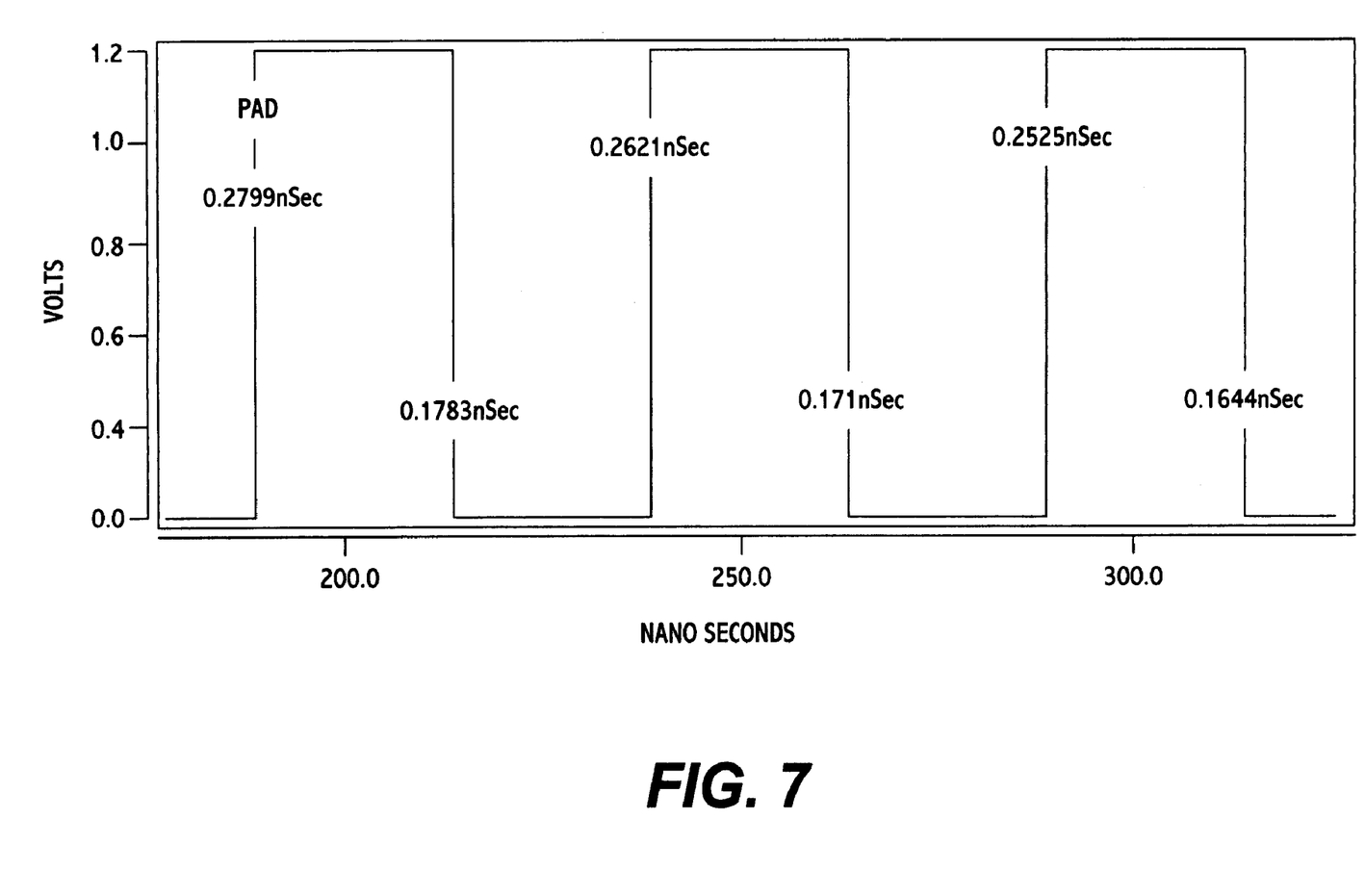
FIG. 7 shows the rise/fall times that were generated at the pad for compensating the pre-driver during a simulation of the control circuit of FIG. 1.

FIG. 7. is a graph showing results obtained for a simulation of the rise/fall time compensation circuit. Here, the target rise/fall time is faster than the pulses shown in the graph. It can be seen that as the compensation machine measures the edge and responds, the edge rates are affected. The rise time of the first pulse is shown as 280 ps. This is slower than the target delay, and the compensation machine increments the counter. This strengthens the pre-driver, which turns on/off the n-pulldown more quickly, and results in the faster rise time on the next pulse of 262 ps. This rise time is still slower than targeted, and the compensation machine again updates the rise time to produce the rise time of 253 ps on the third rising edge. This behavior will continue until the rise time matches the targeted rise time as programmed in the delay line. The falling edges are compensated in the same manner.

Figures 8A, 8B, 8C:
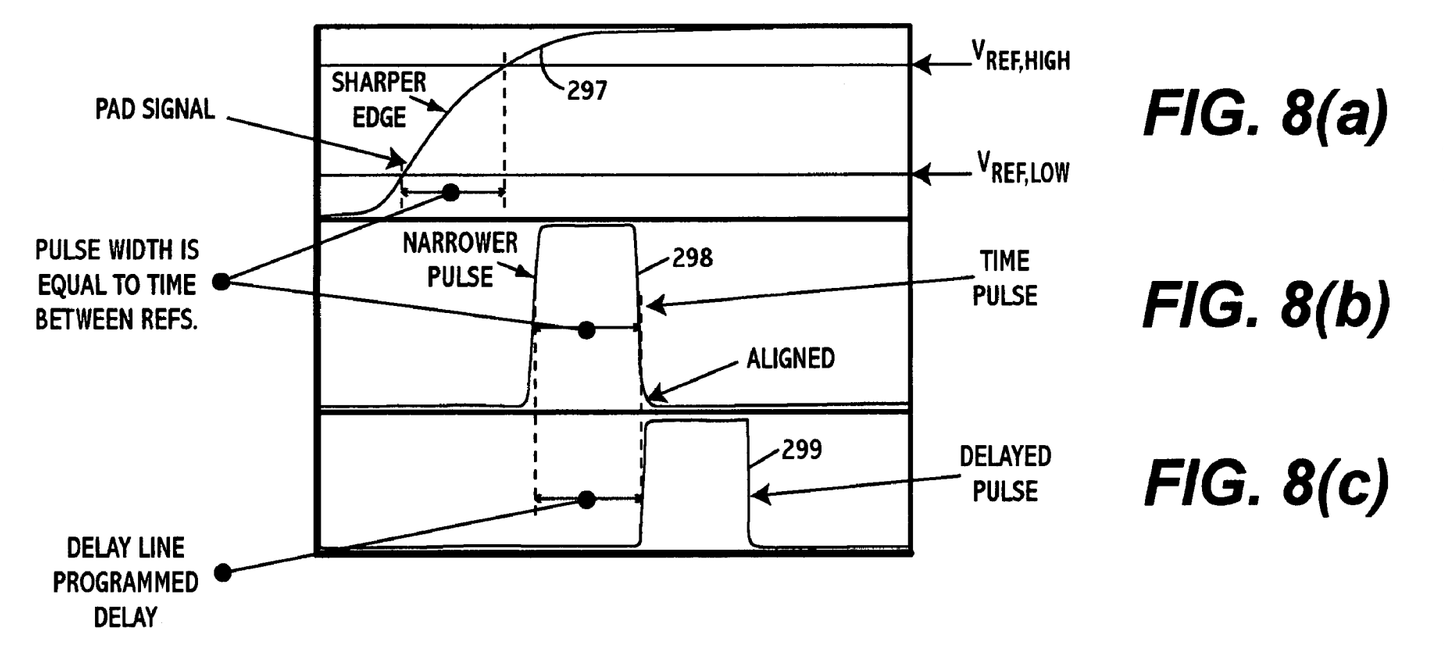
FIGS. 8(a)–(c) are graphs which respectively show a pad signal, a signal generated along the first signal path of FIG. 1, and a signal generated along a second signal path in FIG. 1 during rise/fall time correction in accordance with one embodiment of the present invention.

FIGS. 8(a) is a graph showing a pad signal 297 between high and low reference voltages, $V_{ref,high}$ and $V_{ref,low}$, corresponding to the sense amplifiers of the FIG. 1 circuit, and FIGS. 8(b) and 8(c) respectively show corresponding pulses 298 and 299 produced along the first signal path of the delay circuit in this figure. Graph 8(c) shows a relationship that exists after rise/fall time correction in accordance with one embodiment of the invention, e.g., in this graph the temporal difference between rising edge of the delayed time pulse and the fall edge of the time pulse has been reduced. To achieve optimal results, this difference is preferably reduced to zero. Put differently, the duration of the time pulse has been adjusted to at least substantially equal the delay time programmed into the delay line. When this occurs, the transition time (e.g., the rise and/or fall time) of the driving signal at the pad may be considered to be corrected to an intended value.

Figure 9:
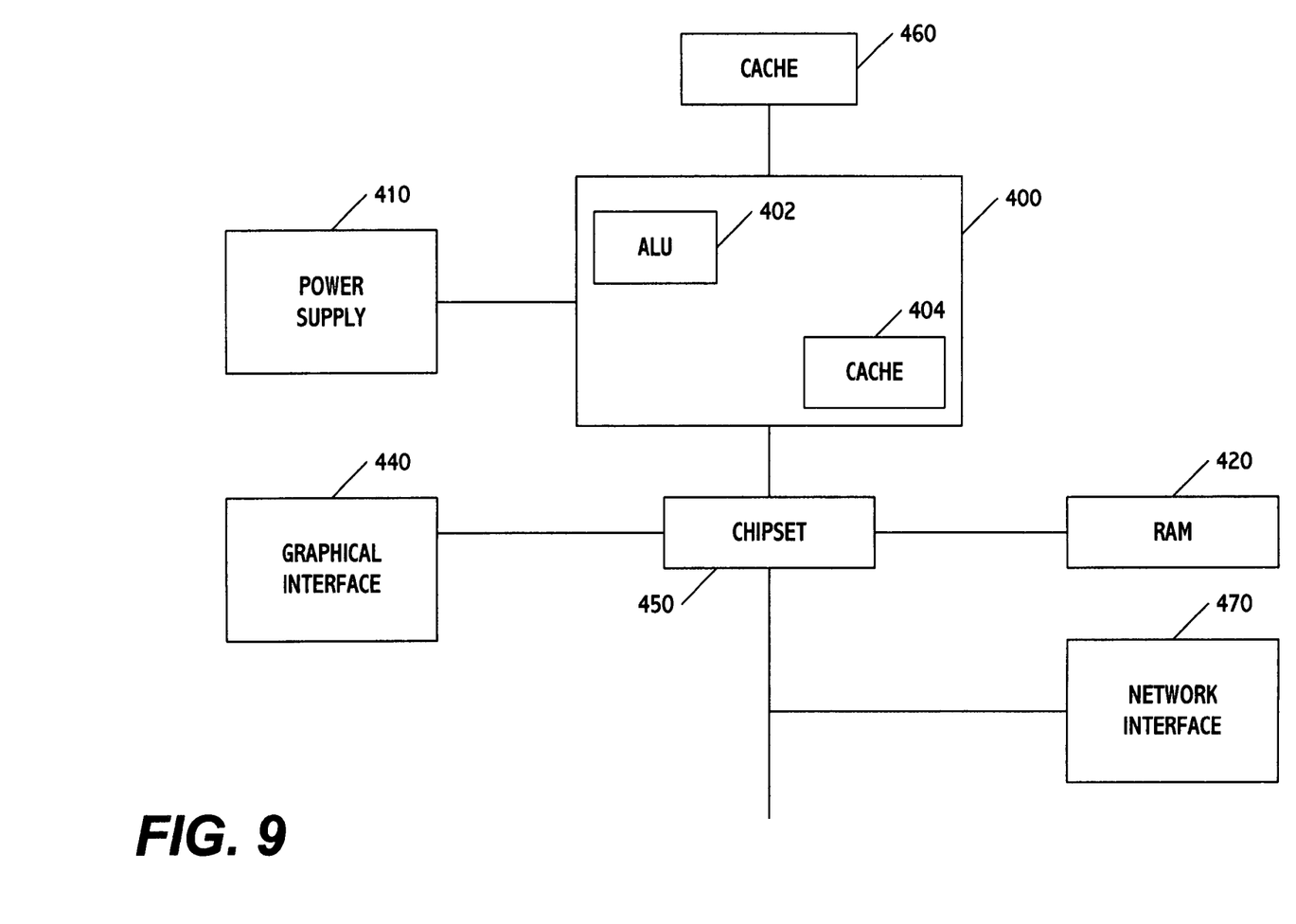
FIG. 9 shows a processing system which may include a control circuit in accordance with any of the embodiments of the present invention.

FIG. 9 shows a processing system which includes a processor 400, a power supply 410, and a memory 420 which, for example, may be a random-access memory. The processor includes an arithmetic logic unit 402 and an internal cache 404. The system also preferably includes a graphical interface 440, a chipset 450, a cache 460, and a network interface 470. The processor may be a microprocessor or any other type of processor. If the processor is a microprocessor, it may be included on a chip die with all or any combination of the remaining features, or one or more of the remaining features may be electrically coupled to the microprocessor die through known connections and interfaces.

In FIG. 9, one or more embodiments of the present invention may be implemented in block 400 to, for example, control the rise or fall time of the I/O signals generated therefrom. The results would produced enhanced performance in terms of maximum operating frequency on the bus between block 400 and block 450, the chipset.

Other modifications and variations to the invention will be apparent to those skilled in the art from the foregoing disclosure. Thus, while only certain embodiments of the invention have been specifically described herein, it will be clear that numerous modifications may be made thereto without departing from the spirit and scope of the invention.

We claim:

1. A correction circuit, comprising:
   a generator to generate a time pulse from an input signal;
   a comparator to compare a duration of the time pulse to a predetermined period; and
   a controller to reduce a difference between the duration of the time pulse and the predetermined period, wherein the predetermined period corresponds to a desired rise/fall time of the input signal and wherein the controller generates correction bits to independently control at least one of a rise time and a fall time of the input signal based on output from the comparator.

2. The circuit of claim 1, wherein the generator includes:
   a sampler to sample the input signal at at least two reference points,
   wherein the duration of the time pulse is based on an elapse of time between the two reference points.

3. The circuit of claim 1, wherein the input signal is an I/O driving signal.

4. The circuit of claim 1, wherein the controller reduces said difference by adjusting the duration of the time pulse.

5. The circuit of claim 4, wherein the controller adjusts the duration of the time pulse to at least substantially equal the predetermined period.

6. The circuit of claim 1, wherein the controller generates the correction bits for independently controlling the rise time and the fall time of the input signal based on said output from the comparator.

7. The circuit of claim 6, further comprising:
   a pre-driver to generate the input signal,
   wherein the correction bits control a strength of the pre-driver based on a result of the comparison, said correction bits being separately applied to adjust the rise time and fall time of the input signal.

8. The circuit of claim 7, wherein the controller generates one or more P-slew bits to control a rise time of the input signal if the time pulse duration is longer than the predetermined period, and generates one or more N-slew bits to control a fall time of the input signal if the time pulse duration is shorter than the predetermined period.

9. The circuit of claim 7, wherein the pre-driver drives a GTL buffer.

10. The circuit of claim 9, wherein the two reference points correspond to 20% and 80% of a waveform of the input signal.

11. A signal processing method, comprising:
generating a time pulse from a input signal;
comparing a duration of the time pulse to a predetermined period; and
reducing a difference between the duration of the time pulse and the predetermined period, wherein the predetermined period corresponds to a desired rise/fall time of the input signal and wherein reducing said difference includes generating correction bits for independently controlling at least one of a rise time and a fall time of the input signal based on a result of said comparison.

12. The method of claim 11, wherein the input signal is an I/O driving signal.

13. The method of claim 11, wherein said difference is reduced by adjusting the duration of the time pulse.

14. The method of claim 13, wherein the duration of the time pulse is adjusted to at least substantially equal the predetermined period.

15. The method of claim 11, wherein reducing said difference includes: generating the correction bits for independently controlling the rise time and the fall time of the input signal based on a result of said comparison.

16. The method of claim 15, wherein generating the correction bits includes:
generating one or more P-slew bits to control a rise time of the input signal if the time pulse duration is longer than the predetermined period; and
generating one or more N-slew bits to control a fall time of the input signal if the time pulse duration is shorter than the predetermined period.

17. The method of claim 11, wherein generating the time pulse includes: sampling the input signal at at least two reference points, wherein the duration of the time pulse is based on an elapse of time between the two reference points.

18. The method of claim 17, wherein the two reference points correspond to 20% and 80% of a waveform of the input signal.

19. The method of claim 11, wherein the input signal is generated by a pre-driver circuit.

20. The method of claim 19, wherein the pre-driver circuit drives a GTL buffer.

21. The method of claim 19, further comprising:
controlling a strength of the pre-driver using the correction bits based on a result of said comparison.

22. The method of claim 21, further comprising:
separately applying the correction bits to adjust the rise time and fall time of the input signal.

23. A system, comprising:
a first circuit; and
a second circuit having a correction circuit which includes:
(a) a generator to generate a time pulse from a input signal;
(b) a comparator to compare a duration of the time pulse to a predetermined period;
(c) a controller to reduce a difference between the duration of the time pulse and the predetermined period, wherein the predetermined period corresponds to a desired rise/fall time of the input signal and the input signal is used to control the first circuit, and wherein the controller generates correction bits to independently control at least one of a rise time and a fall time of the input signal based on output from the comparator.

24. The system of claim 23, wherein the controller reduces said difference by adjusting the duration of the time pulse.

25. The system of claim 23, wherein the controller generates the correction bits for independently controlling the rise time and the fall time of the input signal based on a signal output from the comparator.

26. The system of claim 23, wherein the first and second circuits are selected from the group consisting of a chipset and a memory circuit.

27. The system of claim 23, wherein the first and second circuits are selected from the group consisting of a central processing unit (CPU) and a chipset.

28. The system of claim 27, wherein the CPU and chipset are located on a same motherboard of a computer.

29. A correction circuit, comprising:
a generator to generate a time pulse from an input signal;
a comparator to compare a duration of the time pulse to a predetermined period; and
a controller to generate correction bits for independently controlling a rise time and a fall time of the input signal based on output from the comparator, wherein the predetermined period corresponds to a desired transition time of the input signal.

30. The circuit of claim 29, wherein the comparator includes:
a delay circuit to delay the time pulse by a predetermined delay time; and
a glitch detector to generate a signal indicative of whether the time pulse has a duration longer or shorter than the predetermined delay time, the controller generating the correction bits based on an output of the glitch detector.

31. The circuit of claim 29, wherein the controller includes:
a first counter to count correction bits for independently adjusting a rise time of the input signal; and
a second counter to count correction bits for independently adjusting a fall time of the input signal.

32. The circuit of claim 29, wherein the input signal controls a change in a number of correction bits stored in the first and second counters.

33. The circuit of claim 29, wherein the predetermined period is set by a delay-locked loop circuit.

34. The circuit of claim 29, wherein the correction bits independently adjust a slew rate of a rising portion of the input signal waveform and a slew rate of a falling portion of the input signal waveform.

35. The circuit of claim 34, wherein the correction bits independently adjust the slew rates of the rising and falling portions of the input signal waveform by increasing or decreasing strengths of one or more pre-drivers coupled to the generator.

36. The circuit of claim 29, wherein the generator includes:
a sampling circuit to sample the input signal at first and second trip points; and
a logic circuit to generate the time pulse based on output of the sampling circuit.

37. The circuit of claim 36, wherein the sampling circuit includes first and second sense amplifiers to compare the input signal to reference values corresponding to the first and second trip points respectively, and wherein the logic circuit generates the time pulse based on output of the first and second sense amplifiers.

38. The circuit of claim 36, wherein the first trip point corresponds to a first level of the input signal and the second trip point corresponds to a second level of the input signal.

39. A system, comprising:
a first circuit; and
a second circuit having a correction circuit which includes:
(a) a generator to generate a time pulse from an input signal,
(b) a comparator to compare a duration of the time pulse to a predetermined period, and
(c) a controller to generate correction bits for independently controlling a rise time and a fall time of the input signal based on signals output from the comparator, wherein the predetermined period corresponds to a desired transition time of the input signal and wherein the input signal is used to control the first circuit.

40. The system of claim 39, wherein the correction bits independently adjust a slew rate of a rising portion of the input signal waveform and a slew rate of a falling portion of the input signal waveform.

41. The circuit of claim 40, wherein the correction bits independently adjust the slew rates of the rising and falling portions of the input signal waveform by increasing or decreasing strengths of one or more pre-drivers coupled to the generator.

42. A correction circuit, comprising:
a generator to generate a time pulse from an input signal;
a delay circuit to delay the time pulse by a predetermined time;
a comparator to compare the time pulse and the delayed time pulse; and
a controller to reduce a difference between the time pulse and the delayed time pulse, wherein the predetermined delay time corresponds to a desired transition time of the input signal and wherein the controller generates correction bits to independently control at least one of a rise time and a fall time of the input signal based on output from the comparator.

43. The circuit of claim 42, wherein the first trip point corresponds to a first level of the input signal and the second trip point corresponds to a second level of the input signal.

44. The circuit of claim 42, wherein the controller includes:
a glitch detector to generate a signal indicative of whether a transition time of the time pulse matches the desired transition time of the input signal, the glitch detector generating said signal based on an output of the comparator and the correction bits to be generated based on an output of the glitch detector.

45. The circuit of claim 42, wherein the controller generates the correction bits to independently control a rise time and a fall time of the input signal based on output from the comparator.

46. The circuit of claim 42, wherein the controller includes:
a first counter to count correction bits for independently adjusting a rise time of the input signal; and
a second counter to count correction bits for independently adjusting a fall time of the input signal.

47. The circuit of claim 42, wherein the input signal controls a change in a number of correction bits stored in the first and second counters.

48. The circuit of claim 42, wherein the generator includes:
a sampling circuit to sample the input signal at first and second trip points; and
a logic circuit to generate the time pulse based on output of the sampling circuit.

49. The circuit of claim 48, wherein the sampling circuit includes:
first and second sense amplifiers to compare the input signal to reference values corresponding to the first and second trip points respectively, the logic circuit to generate the time pulse based on output of the first and second sense amplifiers.

50. The circuit of claim 42, wherein the predetermined period is set by a delay-locked loop circuit.

51. The circuit of claim 42, wherein the comparator compares a position of a first edge of the delayed time pulse to a position of a second edge of the time pulse.

52. The circuit of claim 51, wherein the first edge of the delayed time pulse is a leading edge and the second edge of the time pulse is a falling edge.

53. The circuit of claim 51, wherein the controller reduces a difference between a position of the first edge of the delayed time pulse and a position of the second edge of the time pulse.

54. The circuit of claim 53, wherein the controller aligns the first edge of the delayed time pulse with the second edge of the time pulse.

55. The circuit of claim 42, wherein the correction bits independently adjust a slew rate of a rising portion of the input signal waveform and a slew rate of a falling portion of the input signal waveform.

56. The circuit of claim 55, wherein the correction bits independently adjust the slew rates of the rising and falling portions of the input signal waveform by increasing or decreasing strengths of one or more pre-drivers coupled to the generator.

57. A system, comprising:
a first circuit; and
a second circuit having a correction circuit which includes:
(a) a generator to generate a time pulse from an input signal;
(b) a delay circuit to delay the time pulse by a predetermined time;
(c) a comparator to compare the time pulse and the delayed time pulse; and
(d) a controller to reduce a difference between the time pulse and the delayed time pulse, wherein the predetermined delay time corresponds to a desired transition time of the input signal, the controller is to generate correction bits to independently control at least one of a rise time and a fall time of the input signal based on output from the comparator, and the input signal is used to control the first circuit.

58. The system of claim 57, wherein the correction bits independently adjust a slew rate of a rising portion of the input signal waveform and a slew rate of a falling portion of the input signal waveform.

59. The circuit of claim 58, wherein the correction bits independently adjust the slew rates of the rising and falling portions of the input signal waveform by increasing or decreasing strengths of one or more pre-drivers coupled to the generator.

* * * * *